(12) United States Patent
Kuslak et al.

(10) Patent No.: US 7,093,190 B1
(45) Date of Patent: Aug. 15, 2006

(54) SYSTEM AND METHOD FOR HANDLING PARITY ERRORS IN A DATA PROCESSING SYSTEM

(75) Inventors: John S. Kuslak, Blaine, MN (US); Nadeem T. Chaudhry, Eagan, MN (US); Ashiqur Rahman, Brooklyn Center, MN (US)

(73) Assignee: Unisys Corporation, Blue Bell, PA (US)

( * ) Notice: Subject to any disclaimer, the term of this patent is extended or adjusted under 35 U.S.C. 154(b) by 514 days.

(21) Appl. No.: 10/194,816

(22) Filed: Jul. 12, 2002

(51) Int. Cl.
*G11C 29/00* (2006.01)
(52) U.S. Cl. ............... 714/805; 714/48; 714/758
(58) Field of Classification Search ............ 714/805, 714/758, 48, 747, 763, 801, 52, 785
See application file for complete search history.

(56) References Cited

U.S. PATENT DOCUMENTS

| | | | | |
|---|---|---|---|---|
| 3,806,716 A | * | 4/1974 | Lahti et al. ............... | 714/805 |
| 4,088,876 A | * | 5/1978 | Rege ..................... | 714/812 |
| 4,538,265 A | * | 8/1985 | Day et al. ................ | 714/17 |
| 5,177,747 A | * | 1/1993 | Capps et al. ............. | 714/805 |
| 5,515,381 A | * | 5/1996 | Chan ..................... | 714/758 |
| 5,606,662 A | * | 2/1997 | Wisor .................... | 714/48 |
| 5,629,950 A | * | 5/1997 | Godiwala et al. .......... | 714/805 |
| 5,663,969 A | * | 9/1997 | Tsou ..................... | 714/805 |
| 5,781,564 A | * | 7/1998 | Peterson ................. | 714/747 |
| 5,875,201 A | * | 2/1999 | Bauman et al. ............ | 714/800 |
| 5,878,910 A | * | 3/1999 | Gibernau et al. .......... | 221/150 A |
| 6,085,285 A | * | 7/2000 | Lucas et al. ............. | 711/112 |
| 6,473,880 B1 | * | 10/2002 | Cypher .................. | 714/800 |
| 6,598,197 B1 | * | 7/2003 | Peterson et al. .......... | 714/763 |
| 6,742,159 B1 | * | 5/2004 | Sakurai .................. | 714/801 |

\* cited by examiner

*Primary Examiner*—Guy Lamarre
*Assistant Examiner*—Fritz Alphonse
(74) *Attorney, Agent, or Firm*—Beth L. McMahon; Charles A. Johnson; Mark T. Starr (57) ABSTRACT

A method and apparatus is provided for handling parity errors within a data processing system. Each occurrence of a parity error is attributed to an addressable memory location or a block of memory locations that was being accessed when the error occurred. A memory location or a memory block is marked as unusable after a predetermined number of errors is attributed to that location or block, respectively. The predetermined number of errors that is allowed to occur prior to degradation could be two, or more. In one embodiment, the predetermined number of errors resulting in memory degradation is programmable.

41 Claims, 4 Drawing Sheets

SYSTEM AND METHOD FOR HANDLING PARITY ERRORS IN A DATA PROCESSING SYSTEM

FIELD OF THE INVENTION

The current invention relates generally to handling errors within a data processing system; and more particularly, relates to an improved system and method for handling parity errors occurring when instructions and/or data are read from a storage device.

BACKGROUND OF THE INVENTION

Most general-purpose digital computers provide a system for detecting and handling single-bit or multiple-bit parity errors. The occurrence of parity errors is not uncommon when data signals are being read from storage devices such as static random access memories (SRAMs) and dynamic random access memories (DRAMs). This is especially true when high-density memories are employed, as is generally the case in large data processing systems.

Many factors contribute to the occurrence of parity errors. Sources of contamination such as dust are proportionately increased in size relative to the dimensions of individual transistors employed within high density SRAMs and DRAMs, and are therefore more likely to cause latent defects resulting in parity errors. The presence of alpha particles can also cause parity errors. Alpha particles are randomly generated, positively charged nuclear particles originating from several sources, including cosmic rays that come from outer space and constantly bombard the earth, and from the decay of natural occurring radioisotopes like Radon, Thorium, and Uranium. Concrete buildings, lead based products such as solder, paint, ceramics, and some plastics are all well known alpha emitters. Smaller geometry storage devices can be adversely affected by the emission of alpha particles, causing a higher occurrence of parity errors.

In addition to the problems associated with alpha particles and other environmental contaminants, shrinking technology sizes contribute to the occurrence of parity errors. Manufacturing tolerances decrease as geometries decrease, making latent defects more likely to occur. This is particularly true when minimum feature sizes decrease below 0.5 microns.

Because of the potential for parity errors, common data processing systems must be able to efficiently detect and correct these errors. To minimize the impact on system performance, the recovery mechanism must be able to operate without system software intervention. If system software intervention is necessary, performance may suffer because additional references to memory may be required.

One approach to detecting and correcting parity errors relates to storing data signals with additional signals called "check bits". The check bits and associated data signals form a code that can be used to detect and subsequently correct a parity error so that corrected data is returned to a requester. However, this method can add latency since an additional clock cycle may be required to generate the check bits, and another cycle may be required to perform the error detection and, if necessary, data correction.

Another mechanism for handling parity errors involves detecting the error using one or more parity bits. When a parity error is detected, an uncorrupted copy of the data is read from another memory and the corrupted data is discarded. For example, when corrupted data is obtained from a cache memory, an uncorrupted copy may be retrieved from the main memory. This type of approach does not require the use of error correction logic. However, the latency associated with retrieving data from the main memory following the occurrence of a parity error may delay processing activities and decrease system throughput.

The foregoing approaches address the problem of providing corrected data to a requester, but do not necessarily address the root cause of the error. In some cases, an error may occur because a transient, or "soft", error occurred within memory. In this case, the memory location associated with the error may still be used, and is not any more likely than any other memory location to cause a future error. In this case, the system may continue to use the memory location. In other cases, a permanent, or "hard" error is present such that it is likely that any data stored to that memory location will be corrupted. In this latter case, it is desirable to discontinue use of the failing memory location.

Soft errors may generally be distinguished from hard errors by running simple memory tests. However, it is impractical to halt normal system operations and initiate memory tests following the occurrence of any parity error. Therefore, in some prior art systems, the occurrence of any parity error is handled by "degrading" the failing memory location. In other words, the failing location is marked as unusable and is no longer employed to store data signals. Some systems even degrade an entire block of memory locations when a parity error occurs to a location included within that block of memory. Once a memory location, or an entire memory block, is degraded, the degraded memory is no longer used to store data. This effectively reduces the size of the memory.

One mechanism for handling degraded memory involves tracking the number of degraded memory locations or blocks within a physical memory chip. If a large percentage of a particular memory chip has become degraded, the physical chip may be replaced. While this is viable for systems having discrete components, this solution is not workable in highly integrated systems.

Many systems integrate small, fast cache memories with instruction processor logic on a single Application-Specific Integrated Circuit (ASIC). As memory locations or memory blocks are degraded, the memory size of a smaller cache can be reduced to the point where system performance will suffer. This problem cannot readily be addressed by replacing components, since doing so would require replacing both cache and processor logic. This option is not economically feasible.

The above-described dilemma is becoming increasingly common as systems employ higher levels of integration, and as the decreasing technology sizes result in memory devices that are even more susceptible to parity errors. What is needed, therefore, is an improved system and method for handling parity errors in a manner that addresses the foregoing challenges.

SUMMARY OF THE INVENTION

The present invention overcomes the disadvantages found in the prior art by providing a method and apparatus for handling parity errors in a manner that delays the degradation of memory locations and memory blocks. According to the invention, a record is maintained that correlates each occurrence of a parity error with the addressable memory location that was being accessed when the error occurred. In another embodiment, the error is correlated with a block of multiple memory locations that was being referenced when the error occurred. A particular memory block or location is not considered unusable until after a predetermined number of errors has been attributed to that block or location. The predetermined number of errors that is allowed to occur prior to degradation could be two, or more. This allows for the occurrence of some parity errors without causing the immediate degradation of a memory location or block.

According to an embodiment of the invention, the above-described method is implemented in an instruction first-level cache coupled to an instruction processor. When a parity error occurs when an instruction is read from the first-level cache, the error is recorded in a manner that attributes the error to a memory block of the cache. Interrupt generation logic then causes the instruction processor to re-fetch the instruction. The re-fetch operation is directed to a second-level cache that is coupled to the first-level cache so that an uncorrupted copy of the instruction may be obtained. This uncorrupted copy is stored within the first-level cache and execution continues. Any subsequent parity error occurrence is recorded in a like manner. When a predetermined number of parity errors has been attributed to a given memory block within the first-level cache, that memory block is designated as being unusable, and is no longer used to store instructions.

In one embodiment of the invention, the number of parity errors allowed for a given memory location or memory block is programmable. In another embodiment of the invention, the record of the parity errors may be cleared after a predetermined time period elapses. This allows a predetermined number of parity errors to occur within a predetermined time period before a memory location or block is degraded. The inventive system and method may be implemented in any type of storage device that stores instructions and/or other data.

According to one aspect of the invention, a method is provided for handling a parity error in a data processing system. The method includes the steps of receiving a parity error while retrieving data signals stored within a storage location of a first storage device, determining whether a predetermined number of parity errors occurred during prior operations performed to the first storage location, recording the existence of the parity error, and continuing to use the storage location if the predetermined number of parity errors did not occur during the prior operations. If the predetermined number of parity errors did occur, use of the storage location is discontinued.

In one embodiment of the invention, a system is provided for handling a parity error resulting when data signals are read from any storage location within a first storage device. The system includes a second storage device to record the occurrence of the parity error. An error control circuit is coupled to the second storage device to determine whether a predetermined number of previous parity errors was detected when accessing a block of addressable locations that includes the storage location. A second circuit is coupled to the error control circuit to cause the data signals to be re-loaded into the block of addressable locations if the predetermined number of previous parity errors has not been detected.

According to still another embodiment, a system is provided for handling parity errors that occur while accessing a storage device. The system comprises an error control circuit to determine the number of parity errors that has occurred while reading from an addressable location within the storage device, and a circuit to re-load and continue to use the addressable location if the predetermined number of parity errors has not yet occurred. The system further includes a degrade circuit coupled to the error control circuit to prevent further use of the addressable location if the predetermined number of parity errors has occurred.

Yet another aspect of the invention provides a system for handling parity errors when data signals are read from a storage device. The system includes means for detecting a parity error that occurs while reading data signals from a first storage location of the storage device. The system further includes means for determining whether a predetermined number of parity errors were detected while previously accessing any of a group of storage locations that includes the first storage location, and means for continuing to use the group of storage locations if the predetermined number of parity errors has not yet been detected.

Other aspects and embodiments of the invention will become apparent from the following description and the accompanying drawings.

DETAILED DESCRIPTION OF THE DRAWINGS

Figure 1:
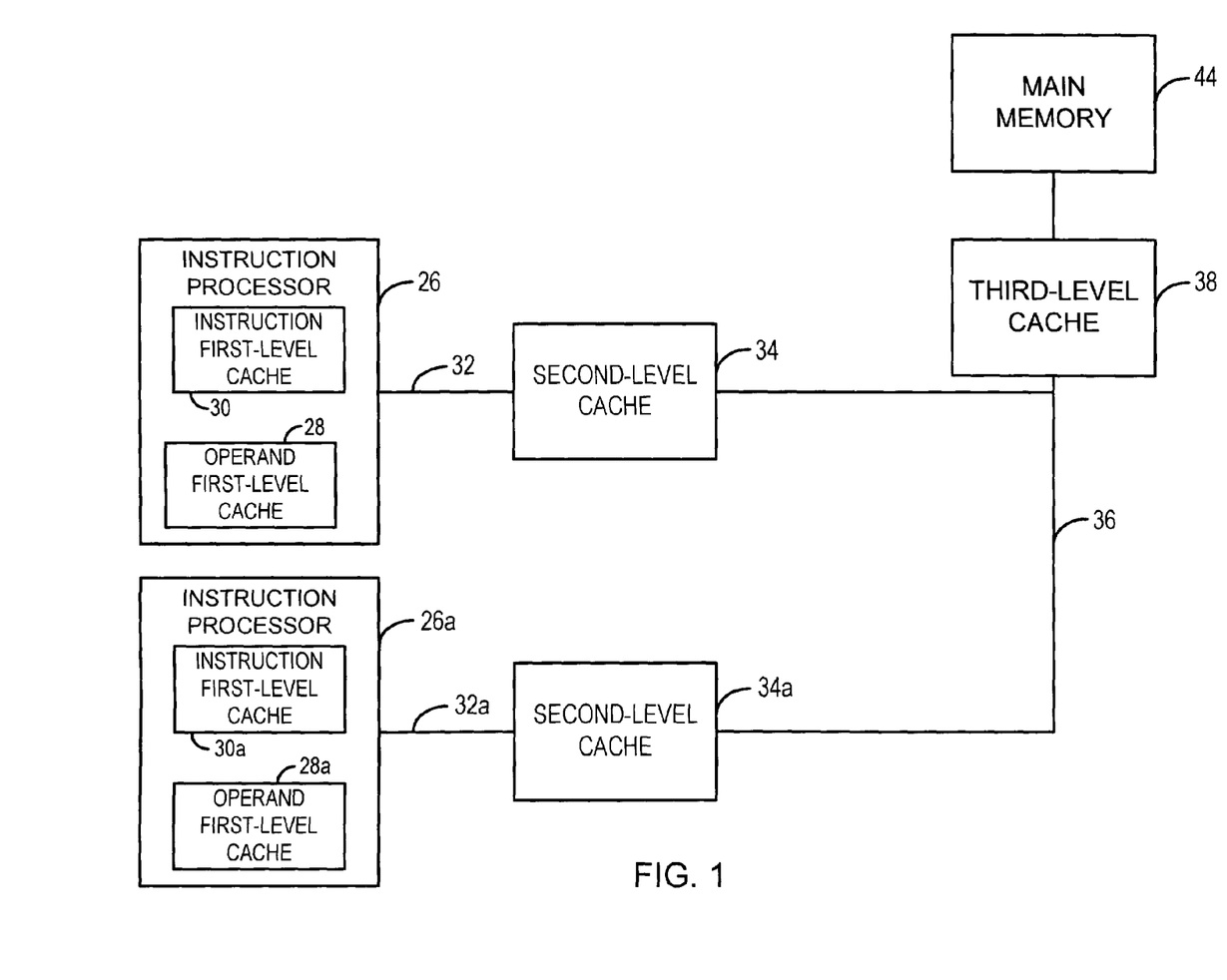
FIG. 1 is a schematic block diagram of an exemplary data processing system that may utilize the current invention.

FIG. 1 illustrates one embodiment of a system that may usefully employ the current invention. However, many other types of systems may utilize the current invention, as will become apparent to those skilled in the art from the following description and accompanying drawings.

The system of FIG. 1 includes an Instruction Processor (IP) 26 having both an Operand First-Level Cache (O-FLC) 28 and an Instruction First-Level Cache (I-FLC) 30. The O-FLC and I-FLC are relatively small, fast, memories for storing recently used operands and instruction opcodes, respectively to speed instruction execution within the IP as is known in the art.

I-FLC and O-FLC are coupled via Interface 32 to a Second-Level Cache (SLC) 34 storing both instructions and operands. Requests for instructions or operands are made to the SLC when the instructions or operands are not located within the I-FLC 30 or the O-FLC 28, respectively. Similarly, the SLC 34 is coupled via a bus interface 36 to a third level cache (TLC) 38. Requests for instructions or operands are made to TLC 38 when the instructions or operands are not located within SLC 34. Additional processors and second-level caches such as IP 26a and SLC 34a may be coupled in a similar manner to TLC 38.

TLC 38 is coupled to a main memory 44. This main memory, which may be comprised of random-access memory (RAM) and/or any other type of memory known in the art, provides the main storage facility for the system. Multiple third-level caches may be coupled to main memory 44 in a manner similar to that shown for TLC 38.

Main memory may be a directory-based system that includes a directory for maintaining data coherency throughout the system. Details associated with a data processing system that has an architecture that is similar to that shown in FIG. 1 are described in commonly assigned U.S. patent application Ser. No. 09/001,598 filed Dec. 31, 1997 entitled "Directory Based Cache Coherency System Supporting Multiple Instruction Processor and Input/Output Caches".

Figure 2:
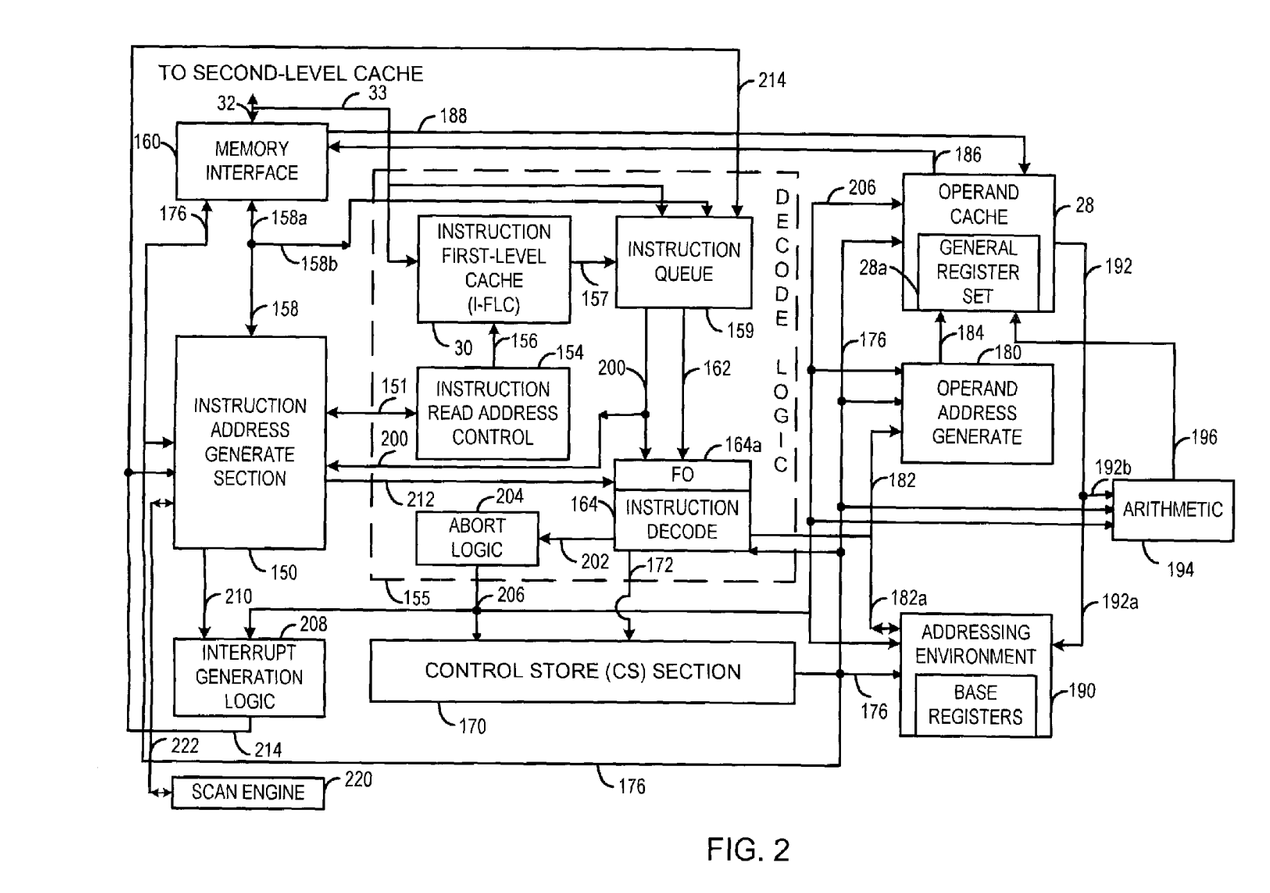
FIG. 2 is a schematic block diagram of an exemplary instruction processor that may utilize the current invention.

FIG. 2 is a block diagram of one embodiment of an Instruction Processor (IP) that may utilize the current invention. This embodiment will be understood to be exemplary only, and many other types of IP architectures may usefully employ the current inventive system and method. The IP of this embodiment includes an instruction address generate section 150 that generates an absolute address used to retrieve an instruction. This address is provided via Instruction Read Address Control 154 to the IP Instruction First-Level Cache (1-FLC) 30 within decode logic 155 (shown dashed). If a cache miss does not occur and the addressed instruction is resident within I-FLC 30, the addressed instruction is transferred to an instruction queue 159 over lines 157. The instruction is staged so that decode may begin.

If a cache miss occurs when attempting to retrieve an instruction from I-FLC 30, the IP suspends pre-fetch instruction execution, meaning that decode operations associated with the current instruction are not initiated. Lines 158a communicate the miss to the IP memory interface 160, which initiates a memory request to the SLC 34 via interface 32. When the instruction is returned, it is provided on data path 33 to instruction queue 159 and to the I-FLC 30 to be cached.

Once in the instruction queue 159, the instruction is staged through a series of staging registers (not shown in FIG. 2), and decode is initiated. Partially decoded instruction signals are provided on lines 162 to an instruction decode section 164, and the instruction opcode is loaded into an instruction register referred to as "F0 register" 164a. The instruction decode section 164, which contains both hardware and microcode decode logic, generates control signals to control the rest of the IP. These control signals include addresses provided over lines 182 to an operand address generate section 180, which generates an operand absolute address that is provided to the operand cache (O-FLC) 28 so that an instruction operand may be retrieved.

After the absolute operand address has been received by the O-FLC 28, it is determined whether the addressed operand is resident in this cache. If the operand is not resident, the IP suspends instruction execution and initiates a memory read operation using a real address generated by the O-FLC 28. This real address is transferred over lines 186 to memory interface 160, which then controls the memory request to the SLC 34 over interface 32. After the operand is returned, it is provided to the O-FLC 28 on lines 188.

Operand data is made available over lines 192b to the arithmetic section 194 for use in performing binary, floating point, and decimal arithmetic operations. The results of these operations are stored back to a set of storage devices known as the General Register Set (GRS) 28a over lines 196.

Also shown in FIG. 2 is control store (CS) section 170, which is a microcode-controlled sequencer. During execution of most "standard" instructions, CS logic does not exercise control over the other logic sections. Instead, control is provided by signals on lines 172 that are generated by decode logic 155 and simply re-driven by CS section 170 onto lines 176. For other non-standard "extended mode" instructions, the CS section drives lines 176 to assert control over the other logic sections. The operation of the CS section is largely beyond the scope of the current invention. For details on a microcode-controlled sequencer for an instruction processor, see commonly assigned U.S. Pat. No. 5,911, 083 to Kuslak, incorporated herein by reference.

The system of FIG. 1 may further include a scan engine 220 coupled to any of the various logic sections of the system via a scan interface 222. For simplicity sake, scan interface 222 is shown coupled only to instruction address generate section 150 of IP 26, although it may be coupled to any of the other logic sections within the system in a similar fashion. This interface provides a serial scan mechanism that may be used to initialize logic, and to select programmable features that may be associated with the system as is known in the art. This is discussed further below.

As discussed above, instructions are read from I-FLC 30 into instruction queue 159. The instructions are then provided to instruction decode 164. In some cases, reading an instruction from I-FLC 30 results in a parity error. As a result, a parity error signal 200 is provided to instruction decode 164 and to instruction address generate section 150. The error causes instruction decode 164 to provide a signal on line 202 that triggers abort logic 204 to issue a current abort signal 206. Current abort signal 206 indicates that execution of the current instruction is to be suspended. This signal is driven to every logic section within IP 26, including interrupt generation logic 208.

In one preferred embodiment of the invention, IP 26 is a pipelined instruction processor. As is known in the art, a pipelined instruction processor includes an "instruction pipeline" that is capable of executing multiple instructions at one time, wherein the instructions are each in different states of completion. In this embodiment, current abort signal 206 allows IP 26 to complete execution of all instructions in the instruction pipeline except the "current" instruction that most recently entered the instruction pipeline, since that current instruction is associated with the parity error. Execution for the current instruction will continue when error recovery is completed, as is discussed below.

After instruction address generate section 150 receives the parity error signal on line 200, that section provides a passive error signal 210 to interrupt generation logic 208 for purposes to be discussed below. Interrupt address generate section then performs error recovery as will be described in the following paragraphs. When error recovery operations are completed, instruction address generate section 150 provides a completion signal on line 212 to instruction decode 164 indicating that the signal on line 202 to abort logic 204 may be de-activated. When the signal on line 202 is no longer asserted, current abort signal 206 is also de-activated.

When asserted, the current abort signal prevents interrupt generation logic 208 from generating an interrupt. When the current abort signal is de-activated, interrupt generation logic is capable of responding to the presence of passive error signal 210. Therefore, after de-activation of the current abort signal, interrupt generation logic generates an interrupt on line 214 to decode logic 155 and to instruction address generate section 150. This causes instruction address generate section 150 to again retrieve the current instruction from memory. Because a parity error occurred the last time the instruction was read from I-FLC 30, the instruction is retrieved from SLC 34 rather than from I-FLC 30. More specifically, instruction address generate section 150 provides the instruction address to memory interface 160 so that the current instruction may be read from SLC 34 and directed to both I-FLC 30 and to instruction queue 159 via path 33. The interrupt signal on line 214 causes this instruction to be loaded into F0 register 164a so that instruction execution is re-started.

According to one embodiment of the invention, when an address is presented to SLC 34 to retrieve an instruction, an entire block of instructions is read from the SLC for storage in I-FLC 30. This memory block of instructions, which may be referred to as a "cache line" of data, may have any predetermined size, and in the current embodiment is 64-bytes long.

When the current instruction and, in some embodiments, the entire cache line, is re-fetched from SLC 34, it is stored within the I-FLC 30. This will overwrite the previous copy of the instruction and correct the parity error assuming the memory location within the cache does not have a permanent, or "hard" error. If a predetermined number of parity errors occurs to the same addressable location, or to any other memory location included within the same memory "block", the entire memory block within I-FLC will be marked as "unusable". In one embodiment, a memory block is a contiguous range of addressable locations within I-FLC that will store one cache line of instructions. This is a design choice that simplifies data coherency management. In another embodiment, a memory block could instead store a partial cache line or multiple cache lines.

As noted above, a memory block is not marked as unusable until after that block experiences a predetermined number of errors. In one embodiment, this predetermined number is "two". That is, after two parity errors occur to the same memory block, that block will be marked as unusable. In another embodiment, this predetermined number can be higher. This is discussed further below.

Figure 3:
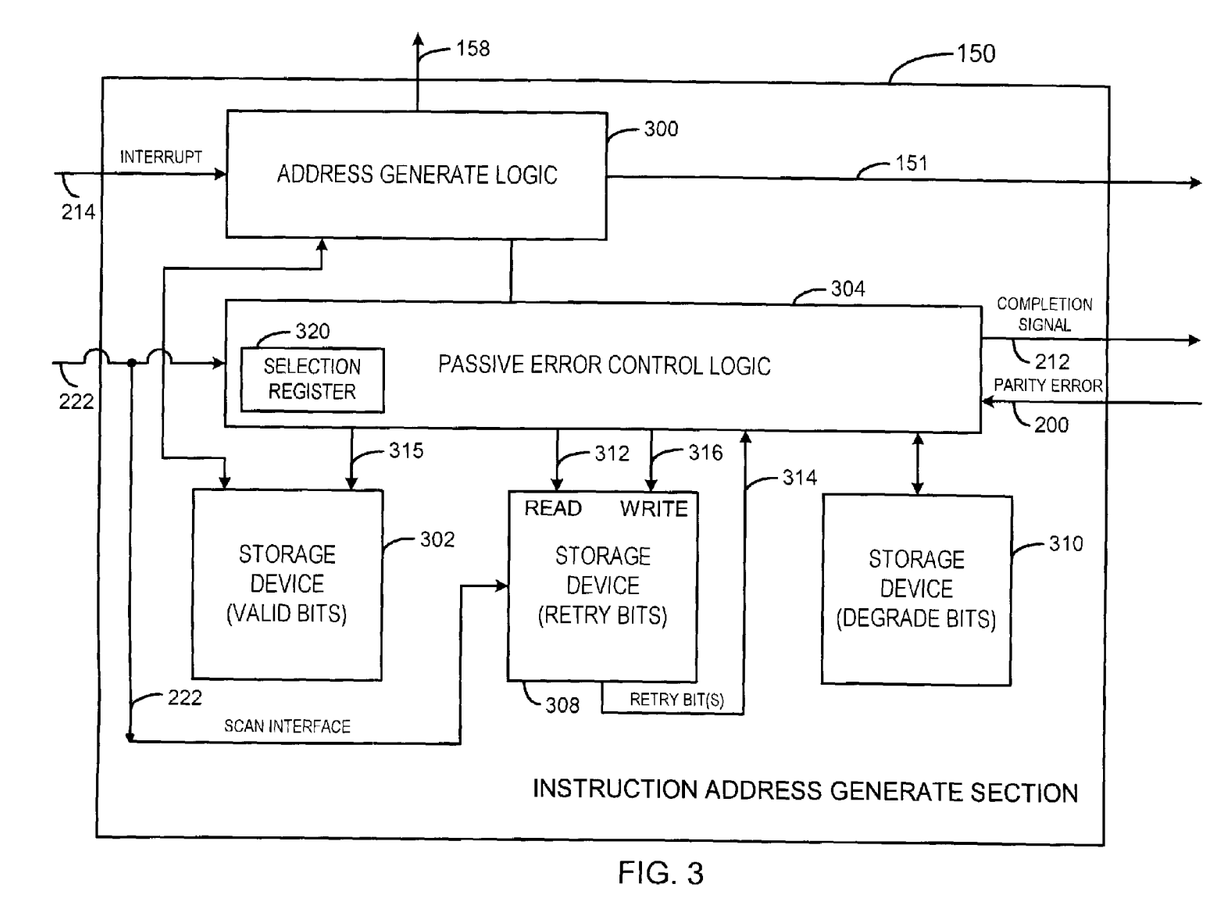
FIG. 3 is a block diagram of the instruction address generation section.

FIG. 3 is a block diagram of the instruction address generation section 150. During normal instruction execution, address generate logic 300 generates an address to be used to fetch the next instruction. This address is provided on lines 151 to instruction read address control 154, and then to I-FLC 30.

Before continuing with a description of the logic shown in FIG. 3, a brief explanation is provided regarding the mechanism used to maintain data coherency between the various other storage devices within the system and I-FLC 30. As noted above, I-FLC 30 stores data in 64-byte cache lines. Each cache line is initially retrieved from SLC 34, the third-level cache 38, or main memory 44 as requested by IP 26. Cache lines may be maintained within I-FLC 30 until the IP no longer requires that data. Cache lines that are no longer required are eventually aged from the cache.

In some instances, a cache line of instructions residing within I-FLC 30 will be marked as "invalid". This occurs, for instance, when another IP in the system has requested exclusive access to that cache line of instructions. When such a request is made by another processor, a request to invalidate the memory block will be received by SLC 34 via bus interface 36, and will be forwarded to address generate logic 300. In response, address generate logic will mark the block as being invalid within I-FLC 30 by clearing an associated valid bit for this cache line. This valid bit is stored within storage device 302, which may be a general register array (GRA) or another type of storage device. The clearing of a valid bit indicates that even though the cache line may still reside within I-FLC 30 such that a cache "hit" will occur when addressing this cache line, that data is no longer considered usable.

Returning to the current example, when an address is provided by address generate section 300 to I-FLC via lines 151, this address is also provided to storage device 302 to read an associated valid bit for the addressed cache line. If the valid bit is cleared for an addressed instruction, address generate logic 300 indicates to decode logic 155 via lines 151 that the memory block retrieved from I-FLC 30 is invalid and may not be used. Address generate logic further issues a request on lines 158 to retrieve the cache line from another storage device. As a result, this cache line will be obtained from SLC 34, or if it is not available within the SLC, from either third-level cache 38 or main memory 44. The retrieved cache line will be stored in I-FLC 30 and also provided to instruction queue 159 via path 33 so that instruction execution may continue. At this time, the valid bit for this cache line will be set within storage device 302.

In another scenario, a valid bit for an addressed cache line is asserted, indicating that data need not be retrieved from another storage device. Therefore, an instruction may be read from I-FLC without accessing another storage device. This operation may cause a parity error such that the parity error signal is asserted on line 200. This parity error signal is received by passive error control logic 304. This may cause passive error control logic 304 to record the occurrence of the parity error within storage device 308 as follows.

Passive error control logic 304 provides an address to storage device 308 on lines 312 upon the occurrence of a parity error. In one embodiment, the address identifies a block of memory addresses within I-FLC 30 that contains the current instruction. The block may be of any size, and in one embodiment is a 64-byte cache line. When the memory block address is provided to storage device 308, one or more "retry" bits are read on lines 314. These retry bits indicate whether any previous parity errors were detected on instructions read from the associated memory block in cache. In one embodiment, only a single retry bit is provided for each memory block, such that a single previous parity error may be recorded.

Passive error control logic 304 receives the one or more retry bits on line 314 and determines, based on these signals, whether a predetermined number of previous parity errors has occurred. As noted above, in one embodiment, this predetermined number of previous parity errors is "one" per memory block, although any number of previous parity errors may be used in other embodiments. If the predetermined number of previous errors has occurred for the current block of memory, this memory block is marked as being unusable, or is "degraded". This is accomplished by setting an associated degrade bit within storage device 310. After a degrade bit is set, the address range within I-FLC 30 that is associated with this degrade bit will no longer be used to cache instructions. This can further be illustrated by example.

For illustration purposes it will be assumed that only a single retry bit is being used for each memory block. Passive error control logic 304 reads the retry bit for the current memory block and determines it is in an inactive state, meaning no other parity errors were previously detected for this memory block. As a result, the current memory block will not be degraded. Passive error control logic 304 then provides an address and control signals on lines 316 to activate the retry bit for the current memory block. Passive error control logic further provides the memory block address to storage device 302 on lines 315 to clear the valid bit for the current memory block. Finally, completion signal 212 is driven to decode logic 155 to signal the completion of error recovery. As discussed above in reference to FIG. 2, this ultimately results in the generation of an interrupt on line 214 to address generate logic 300.

The interrupt received on line 214 is of a type referred to as a "class four" interrupt that is generated in response to the occurrence of a "passive" (non-fatal) error such as a parity error. In response to receiving this type of interrupt, address generation logic 300 provides the current instruction address on lines 151 so that the current instruction is again retrieved from I-FLC 30. In the manner discussed above, the address is also provided to storage device 302 to read the associated valid bit for the cache line that includes the instruction. Because the valid bit was cleared for this memory block during the error recovery operation, the copy of the instruction read from I-FLC 30 must be discarded. Address generation logic 300 instead retrieves the addressed cache line from SLC 34, or alternatively, from third-level cache 38, or from main memory 44, if necessary, and re-writes this cache line into I-FLC 30 over path 33 as discussed above. The valid bit for this cache line is then set in storage device 302 to indicate that a valid copy now resides within I-FLC 30, and the currently addressed instruction is provided to instruction queue 159 so that instruction execution can begin.

Next, assume that another parity error is received for an instruction that resides within the memory block of the I-FLC 30 that experienced the previous parity error. Error recovery will proceed in the manner discussed above. That is, passive error control logic 304 will read the associated retry bit from storage device 308. Because of the previous parity error, this bit is set. As a result, parity error control logic 304 performs a write operation to set an associated degrade bit stored within storage device 310 to degrade the current block of memory within I-FLC 30.

As discussed above, storage device 310 stores a degrade bit for every physical block of memory included within I-FLC 30. According to the current invention, a degrade bit is set only after multiple parity errors have occurred to the same physical block of memory within I-FLC 30. Once a degrade bit is set, the associated block in cache is considered unusable. Any instructions fetched from SLC 34, third-level cache 38, or main memory 40 will not be stored within any of the addressable locations included within a block of cache that has been degraded. This effectively reduces the size of I-FLC 30.

In addition to setting the degrade bit, passive error control logic further clears the associated valid bit stored within storage device 302 in the manner described above. Error recovery is then considered complete, and completion signal 212 can be provided to decode logic 155. As discussed above, a subsequent interrupt will cause the current instruction to be re-fetched. Because the valid bit for the cache line of instructions has been cleared, the cache line is fetched from SLC 34, third-level cache 38, or main memory 40. When this cache line is provided via path 33 to I-FLC 30, it must be stored within a different block of cache memory than had previously stored that cache line, since that previous block has now been degraded and is considered unusable.

The above-described method provides a mechanism for degrading blocks of memory only after an error has been detected multiple times. This approach is particularly useful when managing a smaller memory such as a cache that has been implemented within an ASIC or a similar device. As discussed above, the likelihood of the occurrence of spurious parity errors dramatically increases as geometries of the transistors shrink. If each occurrence of a parity error resulted in the degradation of an associated memory block, the size of the memory may be reduced beyond the point of practical usability. For example, a 128 K-byte instruction cache may soon be reduced to half that size by the continual degradation of its memory blocks. The current invention allows parity errors to occur without requiring this immediate degradation of the associated memory blocks.

Many variations of the above-described system and method are possible within the scope of the current invention. For example, although the invention is discussed in terms of a first-level instruction cache, any other type of storage device may usefully employ this mechanism, including operand first-level cache 28, second-level cache 34, third-level cache 38, main memory 44, or any other storage device provided within a data processing system. It will be appreciated that if a main memory employs this type of mechanism, an uncorrupted copy of data may have to be retrieved from a storage device such as disk following the occurrence of an error. Similarly, if the current method were applied to data stored to a mass storage device such as disk, some other data source would be needed to obtain uncorrupted data following the occurrence of a parity error.

In another variation of the exemplary system, more than one retry bit may be provided for each memory block. For example, a two-bit retry field could be provided for each memory block for use as a counter. Up to four parity errors could be allowed to occur for each block of memory before finally degrading that block. By further expanding the retry field, any number of parity errors could be allowed to occur before an associated memory block is degraded.

In yet another embodiment, the predetermined number of allowed parity errors may be programmable. For example, scan interface 222 could be used to initialize a storage device such as selection register 320 with the number of previous parity errors that would be allowed to occur before any memory block is degraded. Passive error control logic 304 employs this value to determine when to set an associated degrade bit within storage device 310. This selection must, of course, take into account the number of bits that are available within storage device 308 for recording the parity errors. Using this type of selection mechanism, the degradation mechanism may be fine-tuned for the type of memory being used, and the system fault history. If desired, scan interface could be used to disable the retry mechanism entirely such that a memory block is degraded upon a first occurrence of any parity error for that memory block.

In still another variation of the invention, all retry bits may be periodically cleared. This could be accomplished by coupling scan-set interface 222 to storage device 308. The scan operation could be periodically performed under operating system control, for example. Using this mechanism, a predetermined number of errors could be allowed to occur within a predetermined period of time before requiring the degradation of an associated block of memory.

In yet another embodiment, degradation may occur to larger or smaller blocks of storage locations. If desired, degradation could occur for each location, such as on a memory byte or word boundary. This would ensure that a minimum amount of storage is lost when multiple parity errors occur within a given address range. This embodiment would, of course, require the use of larger storage devices to store the retry and degrade bits. It would also complicate the retrieval of instructions using cache lines, since following the degradation of cache memory, cache lines of instructions may have to be stored at addresses that are not aligned on a memory block boundary.

Figure 4:
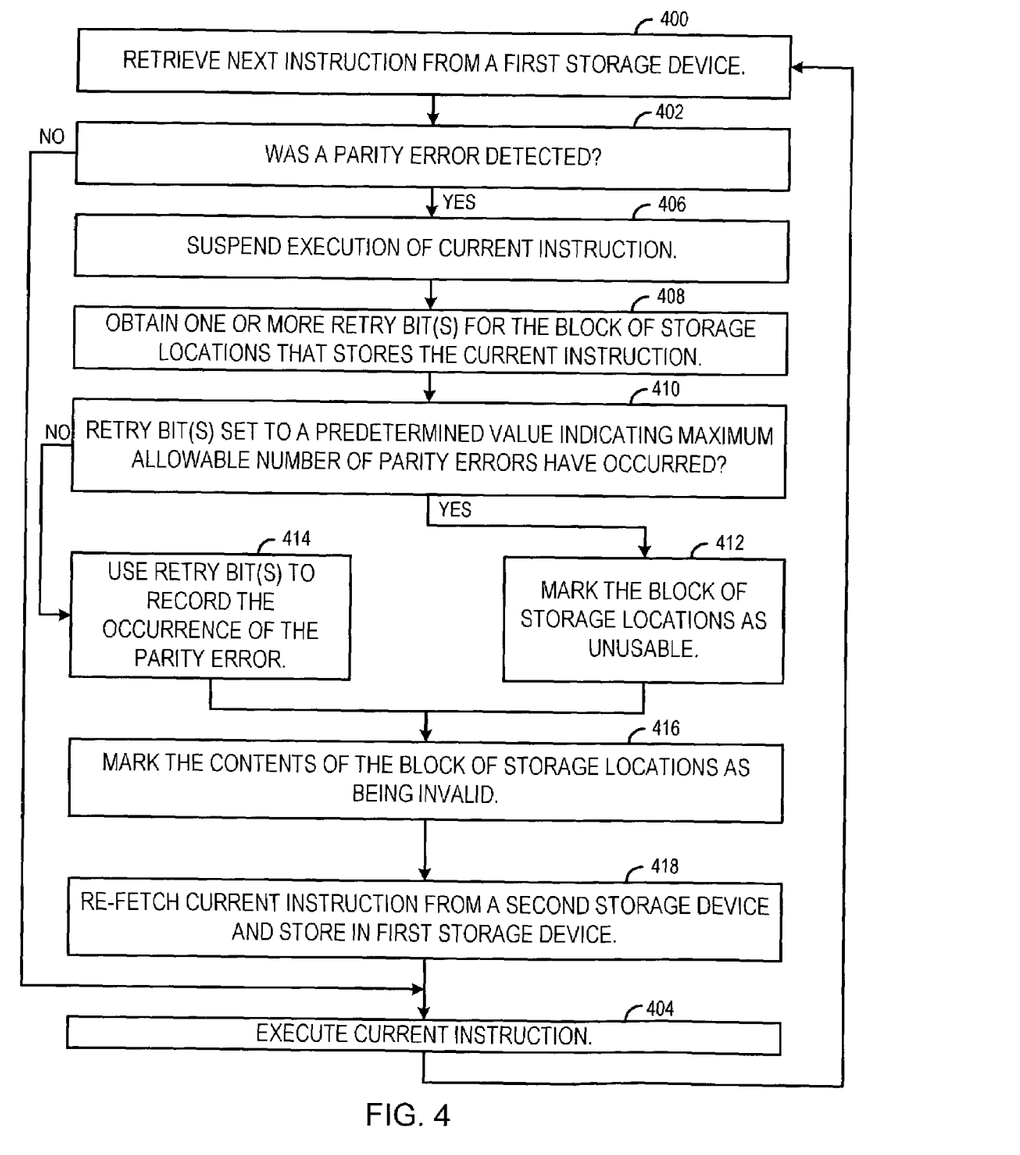
FIG. 4 is a flow diagram of one embodiment of a method according to the current invention.

FIG. 4 is a flow diagram of one embodiment of a method according to the current invention. An instruction is retrieved from a first storage device such as I-FLC 30 (400). A check is made for a parity error (402). If a parity error is not detected on the instruction, the instruction is executed and the process is repeated (404). If, however, a parity error is detected, execution of the current instruction is suspended (406). Next, a determination is made as to whether a predetermined one or more parity errors have already occurred for the block of storage locations that includes the current instruction. This may be accomplished by retrieving one or more retry bits for the block of storage locations (408).

It will be understood that for purposes of the current invention, the "block of storage locations" may include as few as one storage location, and may include as many storage locations as are practical based on design considerations. Moreover, a single retry bit may be used to track the occurrence of a previous parity error, or multiple retry bits may be used to track the occurrence of multiple parity errors.

Returning to step 410, if the retry bit(s) are set to a predetermined value indicating that a maximum allowable number of parity errors has already occurred, the associated memory block is marked as unusable (412). This may be accomplished, for example, by setting an associated degrade bit in a storage device. Otherwise, the state of the one or more retry bit(s) is changed to record the occurrence of the parity error (414). For example, if a single retry bit is employed, this bit may be set to a predetermined state to record the presence of the parity error. If multiple retry bits are used, the bit field could be incremented or decremented to record this occurrence. Other methods of using a bit field to record the occurrence of an event such as a parity error are possible, of course.

After the occurrence of the parity error is recorded, or after the memory block is marked as unusable if the maximum allowable number of parity errors has occurred, the contents of the block of storage locations that is associated with the error are marked as invalid (416). This may be accomplished by setting a corresponding invalid bit in the manner discussed above. The current instruction, or in some embodiments, the entire cache line containing the instruction, is then re-fetched (418). Because the invalid bit for this memory block is set, a second storage device rather than the first storage device is accessed to perform this operation. As discussed above, the second storage device may be SLC 34, third-level cache 38, or main memory 44. This instruction is stored within a block of memory within the first-level cache that has not been marked as unusable, and is further executed by the instruction processor (404). Then the process is repeated with step 400, where the next instruction in an instruction sequence is retrieved from the first storage device.

It will be understood that the above-described systems and methods are exemplary, and the embodiments of the invention herein described are merely illustrative of the principles of the invention. The above embodiments are therefore not intended to limit the scope of the claims, which themselves recite those features regarded as essential to the invention.

What is claimed is:

1. A method for handling a parity error in a data processing system, comprising:
   a.) receiving a parity error while retrieving data signals stored within a storage location of a first storage device;
   b.) determining whether a predetermined number of parity errors occurred during prior operations performed to the first storage location;
   c.) recording the existence of the parity error and continuing to use the storage location if the predetermined number of parity errors did not occur during the prior operations; and
   d.) discontinuing use of the storage location if the predetermined number of parity errors did occur during the prior operations.

2. The method of claim 1, and including repeating steps a.) through d.) for multiple storage locations includes within the first storage device.

3. The method of claim 1, wherein
   step b.) includes determining whether the predetermined number of parity errors occurred during prior operations performed to any storage locations that are included within a block of storage locations, wherein the block of storage locations includes the first location; wherein
   step c.) includes continuing to use the block of storage locations if the predetermined number of parity errors did not occur; and wherein
   step d.) includes discontinuing use of the block of storage locations if the predetermined number of parity errors did occur.

4. The method of claim 3, and further including repeating steps a.) through d.) for multiple blocks of storage locations included within the first storage device.

5. The method of claim 3, wherein step b.) includes obtaining at least one retry bit associated with the block of storage locations.

6. The method of claim 5, wherein step d.) includes recording the existence of the parity error by modifying the state of the at least one retry bit.

7. The method of claim 6, wherein step d.) includes incrementing a value represented by the at least one retry bit.

8. The method of claim 3, wherein the predetermined number of parity errors is one.

9. The method of claim 3, wherein step d.) includes recording that the block of storage locations is degraded.

10. The method of claim 9, and including modifying the state of a degrade bit associated with the block of storage locations.

11. The method of claim 3, wherein step c.) includes re-loading the block of storage locations with an uncorrupted copy of the data signals.

12. The method of claim 11, and further including generating an interrupt to cause the uncorrupted copy of the data signals to be re-loaded.

13. The method of claim 11, wherein step c.) includes:
   recording that contents of the block of storage locations is invalid;
   retrieving the data signals from the block of storage locations of the first storage device;
   discarding the data signals retrieved from the first storage device after determining that the contents of the block of storage locations are invalid;
   re-loading the contents of the block of storage locations with the uncorrupted copy of the data signals; and
   recording that the contents of the block of storage locations are valid.

14. The method of claim 13, wherein the recording steps includes modifying a state of a valid bit associated with the block of storage locations.

15. The method of claim 13, wherein the re-loading step includes retrieving the data signals from a second storage device.

16. The method of claim 15, wherein the first storage device is a first-level cache coupled to an instruction processor, and wherein the second storage device is a second-level cache coupled to the first-level cache.

17. The method of claim 16, wherein the data signals comprise an instruction opcode.

18. The method of claim 1, wherein the first storage device is an instruction first-level cache coupled to an instruction processor.

19. For use in handling a parity error resulting when data signals are read from any storage location within a first storage device, a system comprising:
- a second storage device to record the occurrence of the parity error;
- an error control circuit coupled to the second storage device, the error control circuit to determine whether a predetermined number of previous parity errors was detected when accessing a block of addressable locations that includes the storage location; and
- a second circuit coupled to the error control circuit to cause the data signals to be re-loaded into the block of addressable locations if the predetermined number of previous parity errors has not been detected.

20. The system of claim 19, wherein the first storage device is a cache memory coupled to an instruction processor, and wherein the data signals comprise an instruction to be executed by the instruction processor.

21. The system of claim 20, wherein the second circuit includes interrupt generation logic to cause the instruction processor to re-load the instruction into the cache memory.

22. The system of claim 21, wherein the second circuit includes a memory interface coupled to a third storage device, whereby a copy of the data signals are read from the third storage device and re-loaded into the cache memory.

23. The system of claim 22, wherein the second circuit includes a storage device to record that the contents of the block of addressable locations are invalid, thereby causing the copy of the data signals to be read from the third storage device and re-loaded into the cache memory.

24. The system of claim 23, wherein the third storage device is a second-level cache.

25. The system of claim 19, wherein the predetermined number of previous parity errors is one.

26. The system of claim 19, wherein the predetermined number of previous parity errors is greater than one.

27. The system of claim 19, wherein the error control circuit includes a circuit to allow the predetermined number of previous parity errors to be programmably selected.

28. The system of claim 19, and further including an interface coupled to the second storage device to clear the contents of the second storage device after a predetermined time has elapsed.

29. The system of claim 19, and further including a storage device coupled to the error control circuit to record that the block of addressable locations is unusable if the parity error occurred after the predetermined number of previous parity errors has already been detected.

30. A system for handling parity errors when data signals are read from a storage device, comprising:
- means for detecting a parity error that occurs while reading data signals from a first storage location of the storage device;
- means for determining whether a predetermined number of parity errors were detected while previously accessing any of a group of one or more storage locations that includes the first storage location; and
- means for continuing to use the group if the predetermined number of parity errors has not yet been detected.

31. The system of claim 30, wherein the storage device includes multiple groups of one or more storage locations, wherein the means for determining includes, for each of the multiple groups, means for determining whether a predetermined number of parity errors was detected while previously accessing a respective group, and means for continuing includes means for continuing to use any of the multiple groups if the predetermined number of parity errors has not yet been detected for the respective group.

32. The system of claim 31, wherein the means for determining includes storage means for storing, for each of the multiple groups, an indication of the number of parity errors that were detected while previously accessing the respective group.

33. The system of claim 32, wherein the storage means includes means for storing an indication to record a single parity error for each of the multiple groups.

34. The system of claim 32, wherein the storage means includes means for storing an indication to record multiple parity errors for each of the multiple groups.

35. The system of claim 32, and further including means for discontinuing the use of any of the multiple groups of storage locations if the predetermined number of parity errors was detected for the group.

36. The system of claim 35, wherein the means for discontinuing includes storage means for recording which of the multiple groups of storage locations have been degraded.

37. The system of claim 32, wherein the means for determining includes means for clearing the storage means on a periodic basis.

38. The system of claim 30, wherein the means for continuing includes means for re-loading the group of storage locations with the data signals.

39. The system of claim 38, and further including storage means for storing an additional copy of the data signals, and whereby the means for re-loading retrieves the data signals from the storage means prior to re-loading the group of storage locations.

40. The system of claim 39, wherein the means for continuing to use the group of storage locations includes interrupt generation means for causing the data signals to be retrieved from the storage means.

41. The system of claim 30, wherein the means for determining whether a predetermined number of parity errors were detected includes means for programmably selecting the predetermined number of parity errors.

* * * * *